(12) United States Patent
Gelder (10) Patent No.: US 12,047,050 B2
(45) Date of Patent: Jul. 23, 2024

(54) HIGH-POWER, FREQUENCY-TUNABLE, HARMONIC FILTERING SYSTEM FOR MULTIPLE OPERATING FREQUENCIES AND RELATED METHOD

(71) Applicant: Phil Gelder, Boston, MA (US)

(72) Inventor: Phil Gelder, Boston, MA (US)

(73) Assignee: TRI-TEQ LLC, Boston, MA (US)

( * ) Notice: Subject to any disclaimer, the term of this patent is extended or adjusted under 35 U.S.C. 154(b) by 130 days.

(21) Appl. No.: 17/739,126

(22) Filed: May 8, 2022

(65) Prior Publication Data

US 2022/0368304 A1 Nov. 17, 2022

Related U.S. Application Data

(60) Provisional application No. 63/187,267, filed on May 11, 2021.

(51) Int. Cl.
*H03H 7/01* (2006.01)

(52) U.S. Cl.
CPC ................................ *H03H 7/0115* (2013.01)

(58) Field of Classification Search
CPC ......... H03F 2200/451; H03F 2200/111; H03F 3/195; H03F 1/0277; H03F 2200/222; H03F 2200/411; H03F 1/0227; H03F 2200/414; H03F 2200/231; H03F 2203/21112; H03F 3/189; H03F 3/60; H03F 1/56; H01Q 9/0442; H04B 1/006; H04B 1/18; H04B 2001/0408; H04B 1/0458; H03H 7/461; H03H 7/0115; H03H 7/1758; H03H 2007/013; H03H 7/0153; H01P 1/20; H01P 1/213

See application file for complete search history.

(56) References Cited

U.S. PATENT DOCUMENTS

| | | | |
|---|---|---|---|
| 8,000,737 B2 * | 8/2011 | Caimi | H01Q 1/50 455/550.1 |
| 8,380,146 B2 * | 2/2013 | Parkhurst | H03F 1/56 455/552.1 |
| 9,831,857 B2 * | 11/2017 | Facchini | H03F 1/0288 |
| 11,043,944 B1 * | 6/2021 | Kintigh | H04B 1/44 |
| 11,438,964 B2 * | 9/2022 | Nurikabe | H04B 1/006 |

(Continued)

*Primary Examiner* — Alexander H Taningco (57) ABSTRACT

A high-power, frequency-tunable, harmonic filtering system for multiple operating frequencies includes a first SPMT switch circuitry, a second SPMT switch circuitry, and high-power, frequency-tunable harmonic filters (HFHFs). The first SPMT single-pole terminal is configured to receive a high-power RF input signal. The second SPMT single-pole terminal is configured to output a high-power RF output signal. Each of the HFHFs is connected to a respective one of the first SPMT multi-throw terminals and a respective one of the second SPMT multi-throw terminals. Each of the HFHFs is interposed between the respective first and second multi-throw terminals along a respective RF signal pathway between them. Each operating frequency is associated with one of the HFHFs. The respective operating frequency is associated with one of multiple cutoff frequencies of the respective HFHF. A frequency response of each of the HFHF is tunable to multiple cutoff frequencies in accordance with selection of respective shunt capacitances selectable under control of a controller.

17 Claims, 7 Drawing Sheets

(56) References Cited

U.S. PATENT DOCUMENTS

| | | | |
|---|---|---|---|
| 11,563,410 B1 * | 1/2023 | Xie | H03H 7/465 |
| 11,626,893 B2 * | 4/2023 | Eller | H04B 1/0475 |
| | | | 455/114.1 |

* cited by examiner

HIGH-POWER, FREQUENCY-TUNABLE, HARMONIC FILTERING SYSTEM FOR MULTIPLE OPERATING FREQUENCIES AND RELATED METHOD

BACKGROUND

A harmonic filter is a filter that reduces (filters) harmonics from a signal. A harmonic filter can be regarded as a low-pass filter that has a cutoff frequency between the fundamental frequency and the second-order harmonic frequency. A harmonic filter is made up of passive components including capacitors, inductors, and resistors. A harmonic filter bank is an array of harmonic filters, each of which is configured for a particular passband.

In an RF radio front end, harmonics are generated upon amplification of a radio-frequency (RF) signal by a power amplifier before the signal is emitted from an antenna. In the case of an RF signal having multiple operating frequencies, such as frequency-hopped signal, placing a high-power harmonic filter bank between the power amplifier and the antenna would be highly desirable. As the number of operating frequencies increases, there is a concomitant increase in complexity, size, and power consumption of the high-power harmonic filter bank. Accordingly, improved harmonic filtering systems and methods with less complexity, smaller size, and lower power consumption are desired.

SUMMARY OF THE INVENTION

In one aspect, a high-power, frequency-tunable, harmonic filtering system for multiple operating frequencies includes a first single-pole, multi-throw (SPMT) switch circuitry, a second SPMT switch circuitry, a plurality of high-power, frequency-tunable harmonic filters (abbreviated HFHFs) (numbered 1 through N, N being an integer greater than 1), and a controller. The first SPMT switch circuitry includes a first single-pole terminal, first multi-throw terminals (numbered 1 through N), and first control terminal(s). The first single-pole terminal is configured to receive a high-power radio-frequency (RF) input signal. The second SPMT switch circuitry includes a second single-pole terminal, second multi-throw terminals (numbered 1 through N), and second control terminal(s). The second single-pole terminal is configured to output a high-power RF output signal. Each of the HFHFs is connected to a respective one of the first multi-throw terminals and a respective one of the second multi-throw terminals. Each of the HFHFs is interposed between the respective first multi-throw terminal and the respective second multi-throw terminal along a respective RF signal pathway between them. The controller is coupled to the first control terminals, the second control terminals, and the HFHFs. Each one of the multiple operating frequencies is associated with one of the HFHFs. The respective operating frequency is associated with one of multiple cutoff frequencies of the respective HFHF. A frequency response of each of the HFHFs is tunable to multiple cutoff frequencies (numbered 1 through P, P being an integer greater than 1) in accordance with selection of respective shunt capacitances selectable under control of the controller. For each selected one of multiple operating frequencies (selected operating frequency), the controller is configured to: (1) cause the frequency response of the respective one of the HFHFs (selected HFHF) associated with the selected operating frequency to be tuned to the respective cutoff frequency associated with the selected operating frequency; (2) cause the first SPMT switch circuitry to electrically connect the first single-pole terminal to the respective one of the first multi-throw terminals connected to the selected HFHF; and (3) cause the second SPMT switch circuitry to electrically connect the second single-pole terminal to the respective one of the second multi-throw terminals connected to the selected HFHF. For each selected operating frequency, the selected HFHF is configured to filter harmonics from the high-power RF input signal to produce a high-power RF output signal.

In another aspect, a method of filtering harmonics for multiple operating frequencies includes the steps (A), (B), (C), (D), (E), (F), and (G). Step (A) includes configuring a plurality of high-power, frequency-tunable harmonic filters (abbreviated HFHF) (numbered 1 through N, N being an integer greater than 1). Each one of the multiple operating frequencies is associated with one of the HFHFs. Each respective operating frequency is associated with one of multiple cutoff frequencies of the respective HFHF. A frequency response of each of the HFHFs is tunable to multiple cutoff frequencies (numbered 1 through P, P being an integer greater than 1) in accordance with selection of respective shunt capacitances selectable under control of a controller. Step (B) includes tuning a frequency response of the respective one of the HFHFs (selected HFHF) associated with the selected operating frequency to the respective cutoff frequency associated with the selected operating frequency. Step (C) includes electrically connecting a first single-pole terminal of a first single-pole, multi-throw (SPMT) switch circuitry to a respective one of multiple first multi-throw terminals (numbered 1 through N) of the first SPMT switch circuitry connected to the selected HFHF. Step (D) includes electrically connecting a second single-pole terminal of a second SPMT switch circuitry to a respective one of multiple second multi-throw terminals (numbered 1 through N) of the selected SPMT switch circuitry connected to the selected HFHF. Step (E) includes receiving, by the first single-pole terminal, a high-power radio-frequency (RF) input signal. Step (F) includes filtering, by the selected HFHF, harmonics from the high-power RF input signal to produce a high-power RF output signal. Step (G) includes transmitting, by the second single-pole terminal, the high-power RF output signal. Each of the HFHFs is interposed between the respective first multi-throw terminal and the respective second multi-throw terminal along a respective RF signal pathway between them.

The above summary of the present invention is not intended to describe each disclosed embodiment or every implementation of the present invention. The description that follows more particularly exemplifies illustrative embodiments. In several places throughout the application, guidance is provided through examples, which examples can be used in various combinations. In each instance of a list, the recited list serves only as a representative group and should not be interpreted as an exclusive list.

BRIEF DESCRIPTION OF THE FIGURES

The disclosure may be more completely understood in consideration of the following detailed description of various embodiments of the disclosure in connection with the accompanying drawings, in which.

DETAILED DESCRIPTION OF ILLUSTRATIVE EMBODIMENTS

The present disclosure relates to a high-power, frequency-tunable, harmonic filtering system for multiple operating frequencies, and a method of filtering harmonics for multiple operating frequencies.

In this disclosure:

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the invention.

The terms "comprises" and variations thereof do not have a limiting meaning where these terms appear in the description and claims.

Unless otherwise specified, "a," "an," "the," and "at least one" are used interchangeably and mean one or more than one.

The recitations of numerical ranges by endpoints include all numbers subsumed within that range (e.g., 1 to 5 includes 1, 1.5, 2, 2.75, 3, 3.80, 4, 5, etc.).

For any method disclosed herein that includes discrete steps, the steps may be conducted in any feasible order. As appropriate, any combination of two or more steps may be conducted simultaneously.

Figure 1:
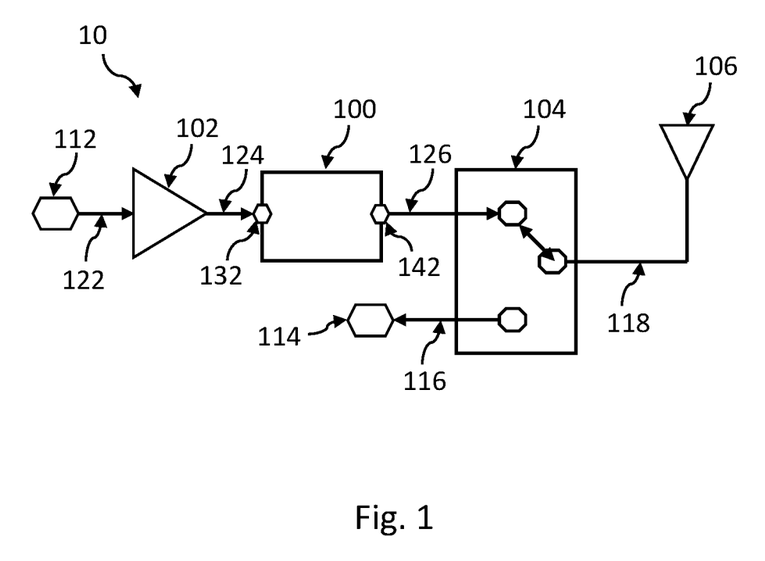
FIG. 1 is a schematic block diagram of a radio's radio-frequency (RF) front-end portion.

FIG. 1 is a schematic block diagram of an RF front-end portion 10 of a radio. The front-end portion 10 includes a high-power, frequency-tunable, harmonic filtering system 100, a power amplifier 102, a transmit/receive switch 104, and an antenna 106. An RF signal 122 is received from a back-end portion of the radio at port 112. The power amplifier 102 receives the RF signal 102 as input, amplifies the RF signal 102, and outputs an amplified RF signal 124. High-power, frequency-tunable, harmonic filtering system 100 receives the amplified RF signal 124 (herein referred to as high-power RF input signal) as input through its input port 132 and outputs a high-power RF output signal 126, from which harmonics have been filtered, through its output port 142 to the transmit/receive (TR) switch 104. When the radio is in a transmit mode, the TR switch connects output port 142 of the system 100 to the antenna 106. The high-power RF output signal reaches the antenna via wiring 118. The high-power RF output signal 126 is emitted from the antenna 106 without additional amplification. When the radio is in receive mode, the TR switch connects the antenna 106 to the receiver port 114. An RF signal that is received by the antenna 106 travels via the wiring 118, the TR switch 104, and another wiring 116 to the receiver port 114. The RF front-end portion 10 is capable of both transmit and receive modes. However, in other implementations in which an RF front-end is transmit-only, the TR switch 104 can be eliminated and the antenna 106 can be connected to the second single-pole terminal 142. Accordingly, a system 100 that additionally includes an antenna connected to the second single-pole terminal is possible.

For example, the RF input signal 124 is a modulated carrier signal characterized by an average power ($P_{ave}$) in a range of 1 to 100 W and a peak-to-average power ratio (PAPR) in a range of 2 to 10 dB. Preferably, the average power of the RF input signal is at least 1 W. On military communication platforms, the operating frequencies of the RF signals are varied using frequency-hopping techniques covering the full extent of the available operating frequency range. For example, operating frequencies of the RF signal are in a range of 2 to 1000 MHz, or 30 to 512 MHz.

Figure 2:
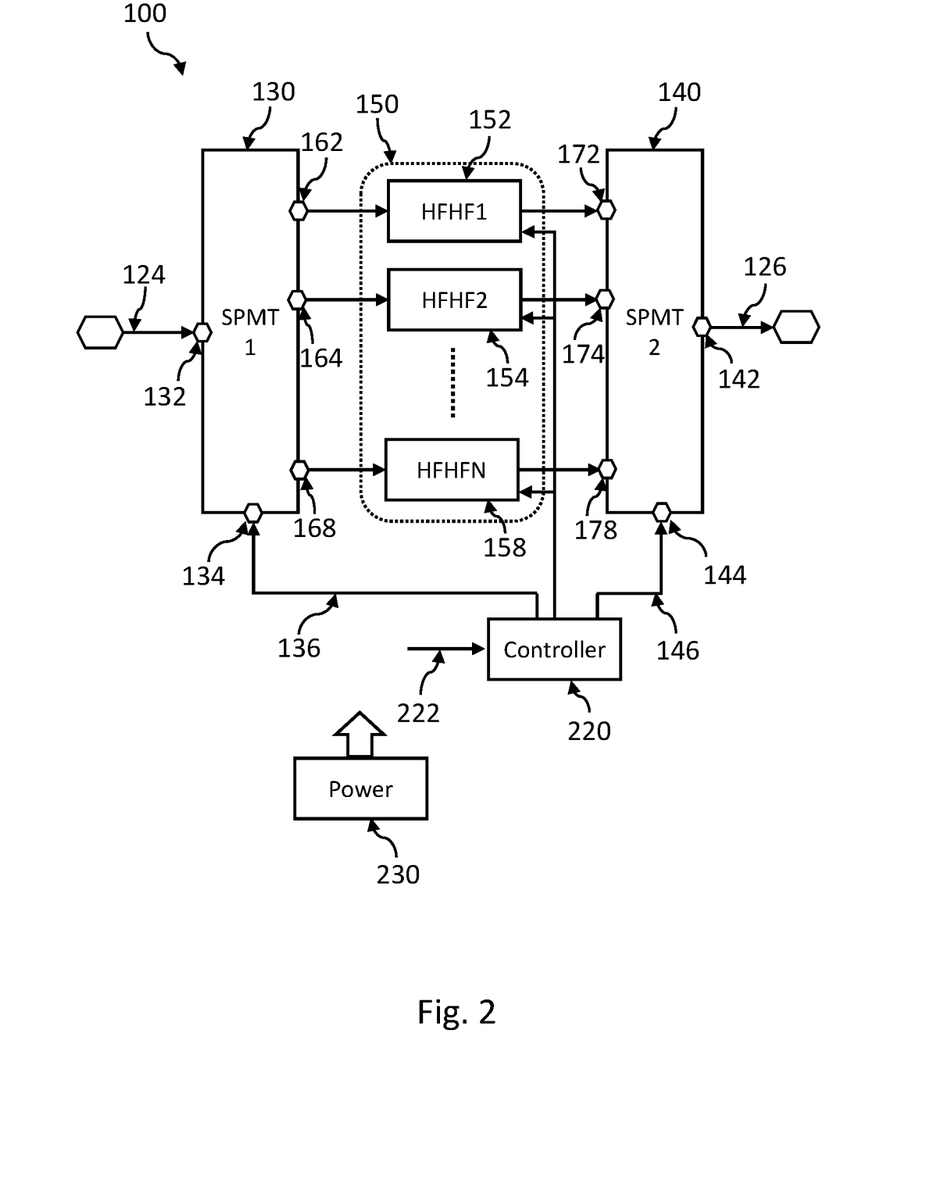
FIG. 2 is a schematic block diagram of a high-power, frequency-tunable, harmonic filtering system including N high-power, frequency-tunable harmonic filters.

FIG. 2 is a schematic block diagram of a high-power, frequency-tunable, harmonic filtering system 100 including N high-power, frequency-tunable harmonic filters 150. Herein, a high-power, frequency-tunable harmonic filter is abbreviated as HFHF. The HFHFs 150 are numbered 1 through N. N is an integer greater than 1. Preferably, N is in a range of 2 through 6. For ease of illustration, FIG. 2 only shows a first HFHF 152, a second HFHF 154, and an $N^{th}$ HFHF 158. System 100 includes a first single-pole, multi-throw (SPMT) switch circuitry 130 and a second SPMT switch circuitry 140. The first SPMT switch circuitry 130 includes a first single-pole terminal 132, first multi-throw terminals (numbered 1 through N), and first control terminal(s) 134. In FIG. 2, first multi-throw terminals 162, 164, and 168 are shown. The first single-pole terminal 132 functions as the input port of system 100. The first single-pole terminal 132 is configured to receive the high-power RF input signal 124. The second SPMT switch circuitry 140 includes a second single-pole terminal 142, second multi-throw terminals (numbered 1 through N), and second control terminal(s) 144. In FIG. 2, second multi-throw terminals 172, 174, and 178 are shown. The second single-pole terminal 142 functions as the output port of system 100. The second single-pole terminal 142 is configured to output the high-power RF output signal 126. System 100 includes controller circuitry 220 coupled to the first control terminal(s) 134, the second control terminals 144, and the HFHFs 150. System 100 additionally includes power supply circuitry 230 that powers the other components in the system 100.

Each of the HFHFs is connected to a respective one of the first multi-throw terminals and a respective one of the second multi-throw terminals. In FIG. 2: (1) first HFHF 152 is connected to a respective first multi-throw terminal 162 and a respective second multi-throw terminal 172; (2) second HFHF 154 is connected to a respective first multi-throw terminal 164 and a respective second multi-throw terminal 174; and (3) $N^{th}$ HFHF 158 is connected to a respective first multi-throw terminal 168 and a respective second multi-throw terminal 178. Each of the HFHFs is interposed between the respective first multi-throw terminal and the respective second multi-throw terminal along a respective RF signal pathway between them.

Figure 3:
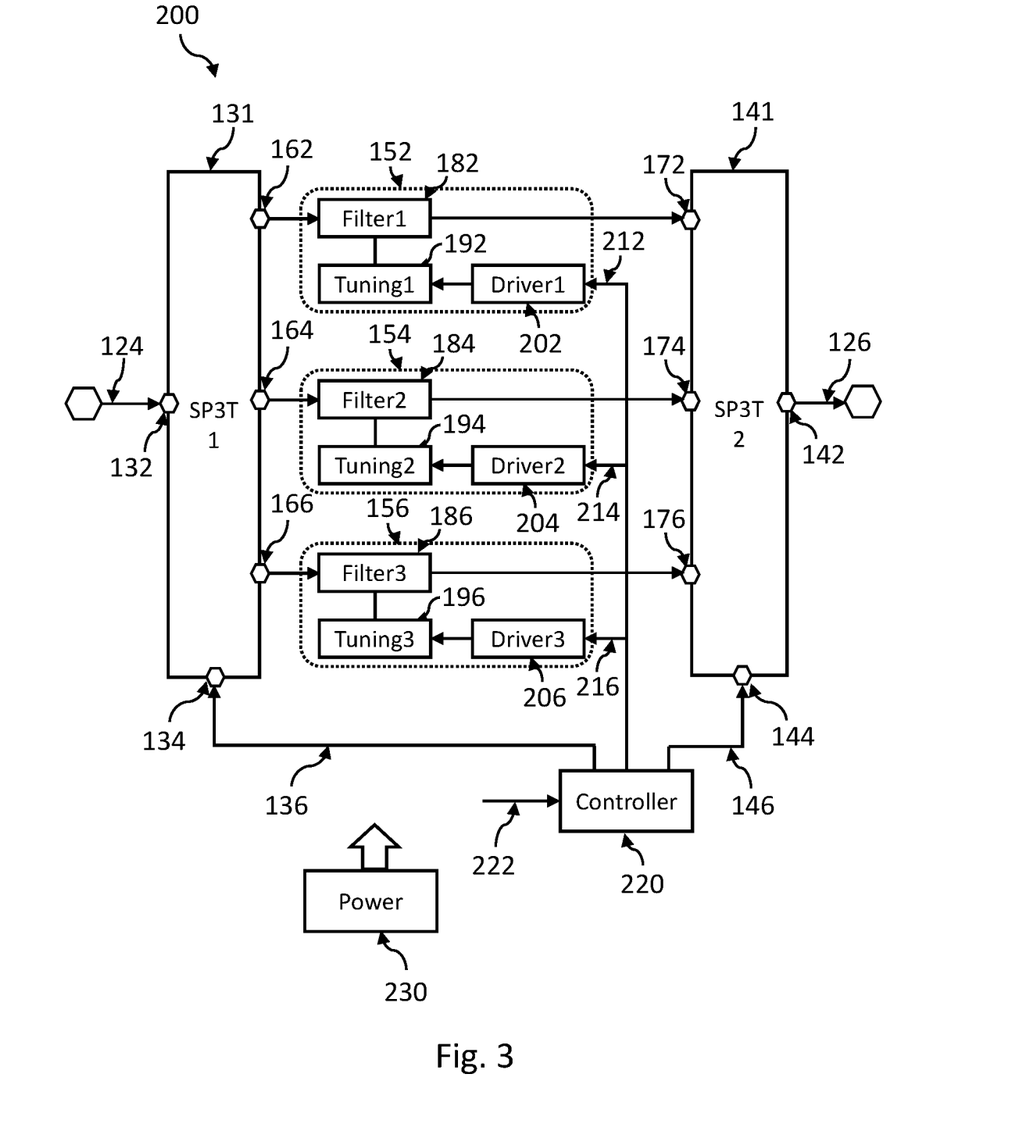
FIG. 3 is a schematic block diagram of a high-power, frequency-tunable, harmonic filtering system including 3 high-power, frequency-tunable harmonic filters.

An example in which the number N of HFHFs is 3 is shown in FIG. 3 FIG. 3 is a schematic block diagram of a high-power, frequency-tunable, harmonic filtering system 200 including 3 high-power, frequency-tunable harmonic filters. System 200 includes a first single-pole, 3-throw (SP3T) switch circuitry 131 and a second SP3T switch circuitry 141. The first SP3T switch circuitry 131 includes first 3-throw terminals 162, 164, and 166. The second SP3T switch circuitry 141 includes second 3-throw terminals 172, 174, and 176. Each of the HFHFs (152, 154, 156) is connected to a respective one of the first multi-throw terminals (162, 164, 166) and a respective one of the second multi-throw terminals (172, 174, 176). Each of the HFHFs is interposed between the respective first multi-throw terminal and the respective second multi-throw terminal along a respective RF signal pathway between them. First single-pole terminal 132, second single-pole terminal 142, high-power RF input signal 124, high-power RF output signal 126, and power supply circuitry 230 are as described with reference to FIG. 2.

Figure 4:
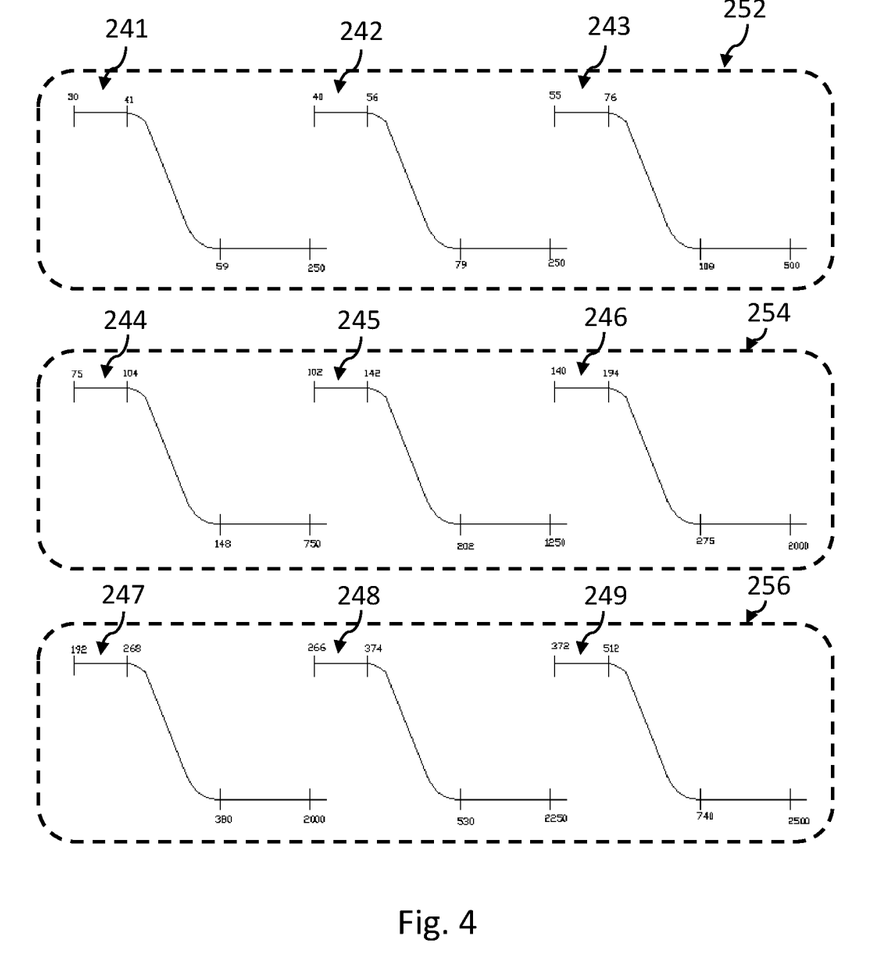
FIG. 4 shows graphical plots of frequency responses of 3-band high-power, frequency-tunable harmonic filters covering a passband tuning range of 30 to 512 MHz.

Each of the HFHFs (152, 154, 156) includes a respective harmonic filter network (182, 184, 186), a respective tuning network (192, 194, 196), and respective diode driver circuitry (202, 204, 206). The controller 220 is connected to each diode driver circuitry (202, 204, 206) via a respective wiring (212, 214, 216). FIG. 4 shows graphical plots of frequency responses of an implementation of 3-band high-power, frequency-tunable harmonic filters covering a passband tuning range of 30 to 512 MHz. A first group 252 of frequency response plots includes frequency response plots 241, 242, and 243. The first group 252 shows the frequency responses of HFHF 152. A second group 254 of frequency response plots includes frequency response plots 244, 245, and 246. The second group 254 shows the frequency responses of HFHF 154. A third group 256 of frequency response plots includes frequency response plots 247, 248, and 249. The third group 256 shows the frequency responses of HFHF 156.

For each frequency response plot, a corresponding passband frequency range, cutoff frequency, and stopband frequency range are tabulated in Table 1. In the example shown in Table 1, there are 9 passbands. The illustrated passband tuning range is 30 to 512 MHz. Accordingly, for any operating frequency within a range of 30 to 512 MHz, each operating frequency corresponds to a respective passband. Each of the passbands is associated with one of the HFHFs (152, 154, 156). The respective passband is associated with one of multiple cutoff frequencies of the respective HFHF. For example, the passband of 40~56 MHz is associated with a cutoff frequency 56 MHz, which is one of three cutoff frequencies of HFHF 152. A frequency response of each of the HFHFs is tunable to multiple cutoff frequencies (numbered 1 through P) in accordance with selection of respective shunt capacitances selectable under control of the controller. P is an integer greater than 1. Preferably, P is 2 or 3. In the example shown, P is 3. In the example shown, a frequency response of each of the HFHFs (152, 154, 156) is tunable to three cutoff frequencies.

TABLE 1

| HFHF No. | Frequency Response Plot No. | Passband Frequency Range (MHz) | Cutoff Frequency (MHz) | Stopband Frequency Range (MHz) |
| --- | --- | --- | --- | --- |
| 152 | 241 | 30-41 | 41 | 59-250 |
| 152 | 242 | 40-56 | 56 | 79-300 |
| 152 | 243 | 55-76 | 76 | 108-400 |
| 154 | 244 | 75-104 | 104 | 148-650 |
| 154 | 245 | 102-142 | 142 | 202-850 |
| 154 | 246 | 140-194 | 194 | 275-1000 |
| 156 | 247 | 192-268 | 268 | 380-1400 |
| 156 | 248 | 266-374 | 374 | 530-2000 |
| 156 | 249 | 372-512 | 512 | 740-2600 |

In the implementation shown in Table 1 and FIG. 4, adjacent passbands have a small overlap. For example, the passbands illustrated by frequency response plots 243 and 244 are overlapped in the range of 75 to 76 MHz. If the operating frequency were 75 MHz, the operating frequency of 75 MHz could be associated with a cutoff frequency of 76 MHz (frequency response plot 243) or a cutoff frequency of 104 MHz (frequency response plot 244). The operating frequency of 75 MHz can be allocated to either passband. If the operating frequency of 75 MHz were allocated to the passband of frequency response plot 243 (cutoff frequency of 76 MHz), then the operating frequency of 75 MHz would be associated with HFHF 152. If the operating frequency of 75 MHz were allocated to the passband of frequency response plot 244 (cutoff frequency of 104 MHz), then the operating frequency of 75 MHz would be associated with HFHF 154.

Figure 5:
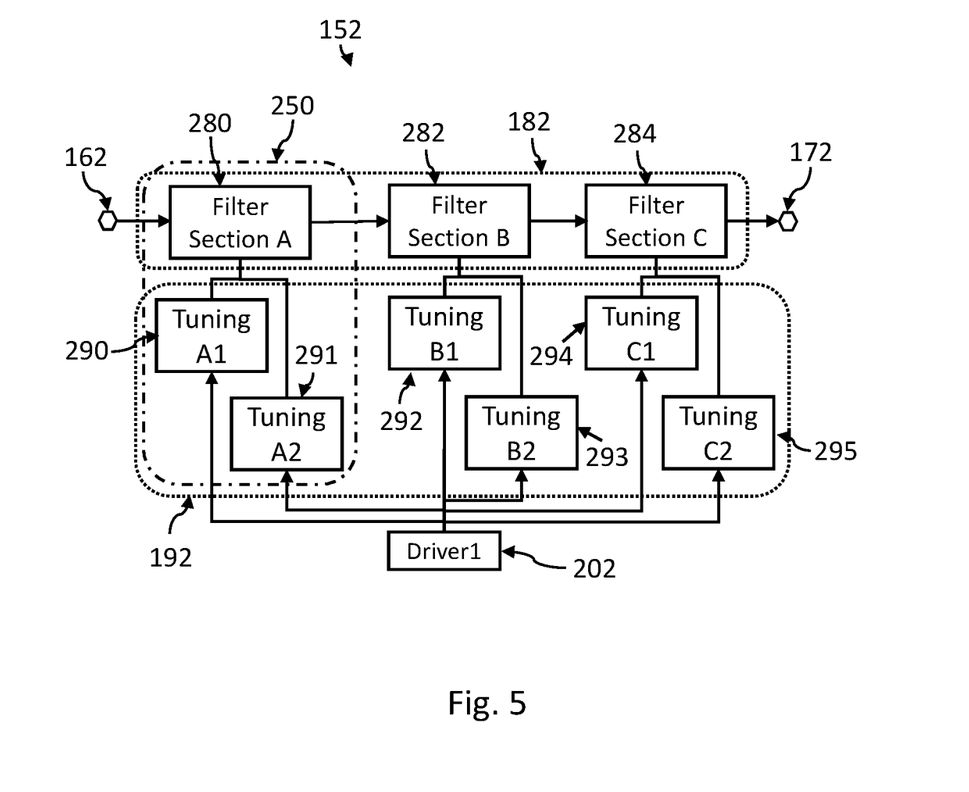
FIG. 5 is a schematic block diagram of a single-channel high-power, frequency-tunable harmonic filter.

High-power, frequency-tunable harmonic filter 152 (FIG. 3) is shown in greater detail in FIG. 5. FIG. 5 shows a schematic block diagram of a single-channel high-power, frequency-tunable harmonic filter. HFHF 152 includes a harmonic filter network 182, a tuning network 192, and diode driver circuitry 202. The harmonic filter network 182 includes a harmonic filter in three cascaded sections: a filter section A (280) connected to first multi-throw terminal 162, a filter section C (284) connected to second multi-throw terminal 172, and a filter section B (282) between filter section A and filter section C. In other implementations, a harmonic filter network can have less than three sections or more than three sections.

The tuning network 192 includes: tuning circuits A1 (290) and A2 (291) connected to filter section A (280), tuning circuits B1 (292) and B2 (293) connected to filter section B (282), and tuning circuits C1 (294) and C2 (295) connected to filter section C (284). Each filter section has two tuning circuits connected to it. Diode driver circuitry 202 is connected to each of the foregoing tuning circuits. The frequency response of HFHF 152 is tunable to three cutoff frequencies (P is 3): $f_c$ (Low frequency)=41 MHz (low frequency response illustrated by plot no. 241), $f_c$ (Medium frequency)=56 MHz (medium frequency response illustrated by plot no. 242), and $f_c$ (High frequency)=76 MHz (high frequency response illustrated by plot no. 243). The frequency response of HFHF 152 is tunable to one of three cutoff frequencies in accordance with selection of a respective shunt capacitance. As a shunt capacitance $C_{SC}$ of a harmonic filter increases, the cutoff frequency $f_c$ decreases. Accordingly, the shunt capacitances for the respective cutoff frequencies are related as follows: $C_{SC}$ (High frequency) <$C_{SC}$ (Medium frequency) <$C_{SC}$ (Low frequency). At each filter section (280, 282, 284), the respective shunt capacitance is tuned to $C_{SC}$ (High frequency) when all of the tuning circuits (290, 291 for filter section A 280; 292, 293 for filter section B 282; and 294, 295 for filter section C 284) are turned OFF. At each filter section (280, 282, 284), the respective shunt capacitance is tuned to $C_{SC}$ (Medium frequency) when a respective first one of the tuning circuits (290, 292, 294) is turned ON and a respective second one of the tuning circuits (291, 293, 295) is turned OFF. At each filter section (280, 282, 284), the respective shunt capacitance is tuned to $C_{SC}$ (Low frequency) when the respective first one of the tuning circuits (290, 292, 294) is turned OFF and the respective second one of the tuning circuits (291, 293, 295) is turned ON. The tuning circuits are turned ON and OFF in accordance with bias voltages applied by the diode driver circuitry 202, under control of the controller 220.

Figure 6:
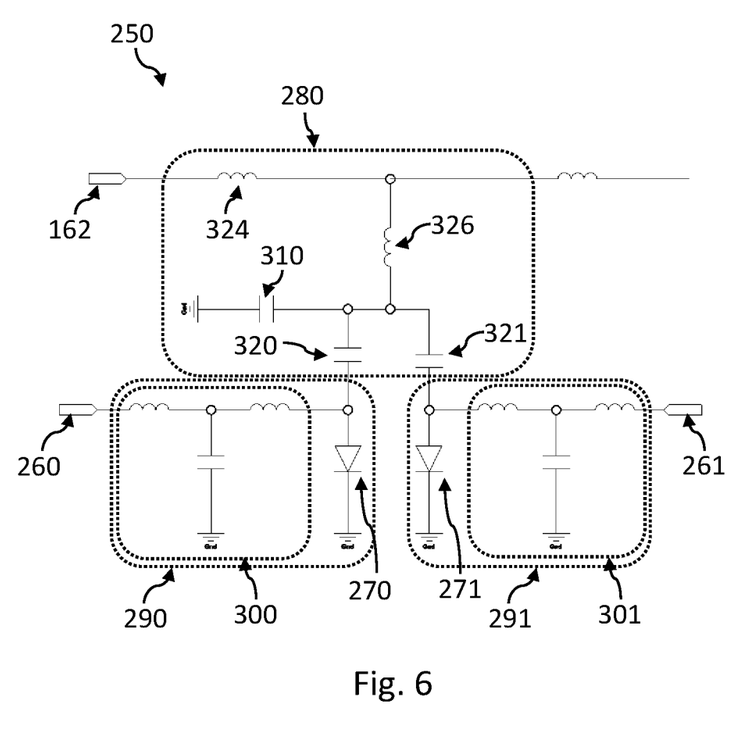
FIG. 6 is a circuit diagram showing an implementation of one section of a high-power, frequency-tunable harmonic filter.

One section 250 of the HFHF 152 includes filter section A (280) and tuning circuits A1, A2 (290, 291) connected to filter section A (280). Consider a possible implementation of section 250 as shown in FIG. 6. FIG. 6 is a circuit diagram showing one possible implementation of a single section 250 of a high-power, frequency-tunable harmonic filter. The filter section A 280 includes the following passive components: capacitors 310, 320, 321 and inductors 324, 326. In the example shown, the capacitance of capacitor 321 is greater than the capacitance of capacitor 320.

The single section 250 includes tuning circuits A1, A2 (290, 291). Tuning circuit A1 (290) includes a diode bias circuit 300 and a PIN diode 270. Tuning circuit A2 (291) includes a diode bias circuit 301 and a PIN diode 271. Diode bias circuit 300 applies bias voltages to the PIN diode 270 in accordance with voltages input from the diode driver circuitry 290 through port 260. Diode bias circuit 301 applies bias voltages to the PIN diode 271 in accordance with voltages input from the diode driver circuitry 291 through port 261. A shunt capacitance of $C_{SC}$ (High frequency) is realized when capacitor 310 add to the shunt capacitance and capacitors 320, 321 do not add to the shunt capacitance. This corresponds to the tuning circuits 290, 291 being turned OFF (PIN diodes 270, 271 being turned OFF). A shunt capacitance of $C_{SC}$ (Medium frequency) is realized when capacitors 310, 320 add to the shunt capacitance but capacitor 321 does not add to the shunt capacitance. This corresponds to the tuning circuit 290 being turned ON and turning circuit 291 being turned OFF (PIN diode 270 being turned ON and PIN diode 271 being turned OFF). A shunt capacitance of $C_{SC}$ (Low frequency) is realized when capacitors 310, 321 add to the shunt capacitance but capacitor 320 does not add to the shunt capacitance. This corresponds to the tuning circuit 290 being turned OFF and turning circuit 291 being turned ON (PIN diode 270 being turned OFF and PIN diode 271 being turned ON). Capacitor 310 is hardwired to GND so it always contributes to the shunt capacitance regardless of the switching state of the turning circuits 290, 291. Capacitor 320 adds to the shunt capacitance when the PIN diode 270, to which it is connected in series, is turned ON. Capacitor 321 adds to the shunt capacitance when the PIN diode 271, to which it is connected in series, is turned ON.

In the circuit implementation of one section of a harmonic filter shown in FIG. 6, PIN diodes are used to tune the shunt capacitance. Other circuit implementations are possible in which switching elements other than PIN diodes are used. In such cases, a bias circuit configured to apply bias voltages to the switching element may be needed instead of a diode bias circuit (300, 301). Additionally, the diode driver circuitry 202 (FIG. 5) would be replaced by a driver circuitry configured to drive the switching element.

The circuit implementation of one section of a harmonic filter shown in FIG. 6 uses an elliptic filter. In this example, an elliptic filter is used to obtain maximum rejection using the minimum number of filter sections. Nevertheless, the harmonic filtering system and related method as disclosed herein can be implemented using a non-elliptic filter, such as a Chebyshev filter. When using a Chebyshev filter, more filter sections may be needed to achieve the desired selectivity.

The high-power RF input signal 124 can be a frequency-hopped RF signal in which the operating frequency of the RF signal varies within the passband tuning range shown in Table 1. For each selected one of multiple operating frequencies (selected operating frequency), there is a corresponding HFHF (selected HFHF) that can be configured to filter harmonics from the RF input signal at that selected operating frequency. The controller 220 receives a control signal 222 which indicates the selected operating frequencies in the frequency-hopped RF signal. Information conveyed by the control signal 222 can be in the form of (1) identification of selected operating frequencies; or (2) information derived from the selected operating frequencies. An example of the latter is identification of selected HFHFs and the selection of a shunt capacitances for the selected HFHFs. For each selected operating frequency, the controller is configured to cause the frequency response of the respective one of the HFHFs (selected HFHF) associated with the selected operating frequency to be tuned to the respective cutoff frequency associated with the selected operating frequency. As shown in the foregoing, this is accomplished by controlling the respective diode driver circuitry (e.g., 212, 214, 216, or 218) to turn the respective tuning circuits ON and OFF.

Additionally, the controller 220 is configured to cause the first SPMT switch circuitry 130 to electrically connect the first single-pole terminal 132 to the respective one of the first multi-throw terminals (162, 164, or 168) connected to the selected HFHF (152, 154, or 158). In the example shown in FIGS. 2 and 3, the controller sends control signals 136 to the first control terminals 134 of the first SPMT switch circuitry 130 or the first SP3T switch circuitry 131. The controller 220 is configured to cause the second SPMT switch circuitry 140 to electrically connect the second single-pole terminal 142 to the respective one of the second multi-throw terminals (172, 174, or 178) connected to the selected HFHF (152, 154, or 158). In the example shown in FIGS. 2 and 3, the controller sends control signals 146 to the second control terminals 144 of the second SPMT switch circuitry 130 or the second SP3T switch circuitry. Accordingly, for each selected operating frequency, the high-power RF input signal 124 is routed, by the first SPMT switch circuitry 130 (or first SP3T switch circuitry 131) from the first single-pole terminal 132 to the selected HFHF. The selected HFRF filters harmonics from the high-power RF input signal 124 to produce a high-power RF output signal 126. The high-power RF output signal 126 is routed by the second SPMT switch circuitry 140 (or second SP3T switch circuitry 141) to the second single-pole terminal 142. The high-power RF output signal 126 is transmitted by the second single-pole terminal 142.

Each RF filter has a passband insertion loss. This loss in energy occurs in transforming the RF input signal to the RF output signal. Typically, the loss is referring to loss of energy in the passband. The energy lost is dispersed as heat. When the RF input signal is a high-power RF input signal, the amount of dissipated heat can be significant, leading to degradation and/or failure of components over time. In the worst cases, the failure of components can be immediate.

The high-power, frequency-tunable, harmonic filtering system and related method as disclosed herein can reduce the amount of heat generated. In the implementation shown in FIGS. 3 and 4, 9 filter states (9 passbands) are realized using 3 filters (152, 154, 156). In the example shown, the system covers a passband tuning range of 30 to 512 MHz. Without the benefit of frequency-tunable harmonic filters, one might contemplate constructing a harmonic filtering system covering this passband tuning range using 6 fixed-frequency harmonic filters. A frequency response characteristic of each such fixed-frequency harmonic filter would need to cover a wider passband and be of greater selectivity than a frequency response characteristic of each filter state of a frequency-tunable harmonic filter. For example, in the frequency-tunable implementation (FIGS. 3 and 4), the lowest frequency filter state has the following characteristics: passband from 30 to 41 MHz and stopband from 59

MHz. On the other hand, in a fixed-frequency implementation, the lowest frequency filter might have the following characteristics: passband from 30 to 50 MHz and stopband from 59 MHz. Accordingly, the fixed-frequency harmonic filter in a typical implementation would need to be of significantly greater selectivity.

The frequency-tunable implementation (FIGS. 3 and 4) also enables a reduction in a footprint area of the system. Compared to the fixed-frequency implementation, the number of filters is reduced from 6 to 3. In the fixed-frequency implementation, SP6T (single-pole, 6-throw) switch circuits would be needed at the RF input and RF output ends, Each SP6T circuit would be implemented as a cascade of one SPDT (single-pole, double-throw) switch and two SP3T switches. In the frequency-tunable implementation (FIGS. 3 and 4), two SP3T switches would be used. Compared to the fixed-frequency implementation, the number of SPMT switches is reduced from 6 to 2. We have considered typical implementation of a high-power, frequency-tunable, harmonic filtering system in which N is 3 and P is 3. In cases where the RF input signal is characterized by an average power ($P_{ave}$) in a range of 5 to 20 W and a peak-to-average power ratio (PAPR) in a range of 2 to 10 dB, a footprint area of the system can be 27 cm$^2$ or less. In cases where the RF input signal is characterized by an average power ($P_{ave}$)) of 50 W or less and a peak-to-average power ratio (PAPR) in a range of 2 to 10 dB, and a footprint area of the system is 50 cm$^2$ or less.

Another way to compensate for the heat generated is to use larger electrical components that can better withstand the heat. Typically, when larger components are used in the system, a larger heat sink can be attached to the body of the system and a fan can be added to dissipate the heat. This thermal management approach can be effective when there is no need to reduce the footprint area of the system.

Yet another way to compensate for the heat generated is to use heat dissipating elements including thermal bridges and mini heat fins. Thermal bridges are electrically non-conductive elements made from aluminum nitride and provide excellent thermal conductivity. Thermal bridges are placed along high-power wiring to ground. Mini heat fins are positioned to contact portions of the RF circuit directly near the inductive elements. Conductive epoxy is used to attach the heat fins to the inductors.

Figure 7:
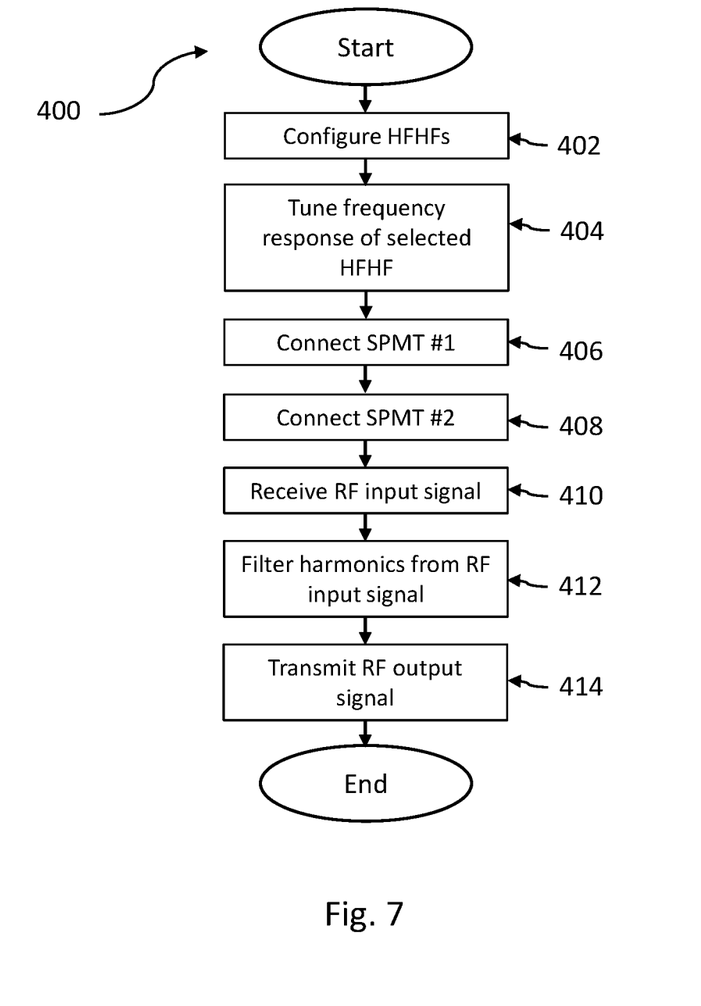
FIG. 7 is a flow diagram of a method of filtering harmonics for multiple operating frequencies.

FIG. 7 is a flow diagram of a method 400 of filtering harmonics for multiple operating frequencies. Method 400 includes steps 402, 404, 406, 408, 410, 412, and 414. Step 402 includes configuring a plurality of high-power, frequency-tunable harmonic filters (abbreviated HFHF) (numbered 1 through N, N being an integer greater than 1). Each one of the multiple operating frequencies is associated with one of the HFHFs. Each respective operating frequency is associated with one of multiple cutoff frequencies of the respective HFHF. A frequency response of each of the HFHFs is tunable to multiple cutoff frequencies (numbered 1 through P, P being an integer greater than 1) in accordance with selection of respective shunt capacitances selectable under control of a controller.

Step 404 includes tuning a frequency response of the respective one of the HFHFs (selected HFHF) associated with the selected operating frequency to the respective cutoff frequency, associated with the selected operating frequency.

Step 406 includes electrically connecting a first single-pole terminal of a first single-pole, multi-throw (SPMT) switch circuitry to a respective one of multiple first multi-throw terminals (numbered 1 through N) of the first SPMT switch circuitry connected to the selected HFHF. Step 408 includes electrically connecting a second single-pole terminal of a second SPMT switch circuitry to a respective one of multiple second multi-throw terminals (numbered 1 through N) of the selected SPMT switch circuitry connected to the selected HFHF. Each of the HFHFs is interposed between the respective first multi-throw terminal and the respective second multi-throw terminal along a respective RF signal pathway between them.

Step 410 includes receiving, by the first single-pole terminal, a high-power radio-frequency (RF) input signal. Step 412 includes filtering, by the selected HFHF, harmonics from the high-power RF input signal to produce a high-power RF output signal. Step 414 includes transmitting, by the second single-pole terminal, the high-power RF output signal. In some cases, step 414 can include, emitting the high-power RF output signal from an antenna connected to the second single-pole terminal without additional amplification.

What is claimed is:

1. A high-power, frequency-tunable, harmonic filtering system for multiple operating frequencies, comprising:
   a first single-pole, multi-throw (SPMT) switch circuitry, comprising a first single-pole terminal, first multi-throw terminals (numbered 1 through N, N being an integer greater than 1), and first control terminal(s), the first single-pole terminal being configured to receive a high-power radio-frequency (RF) input signal;
   a second SPMT switch circuitry, comprising a second single-pole terminal, second multi-throw terminals (numbered 1 through N), and second control terminal(s), the second single-pole terminal being configured to output a high-power RF output signal;
   a plurality of high-power, frequency-tunable harmonic filters (abbreviated HFHFs) (numbered 1 through N), each of the HFHFs being connected to a respective one of the first multi-throw terminals and a respective one of the second multi-throw terminals, each of the HFHFs being interposed between the respective first multi-throw terminal and the respective second multi-throw terminal along a respective RF signal pathway between them; and
   a controller coupled to the first control terminal(s), the second control terminal(s), and the HFHFs;
   wherein each one of the multiple operating frequencies is associated with one of the HFHFs, the respective operating frequency being associated with one of multiple cutoff frequencies of the respective HFHF, a frequency response of each of the HFHFs being tunable to multiple cutoff frequencies (numbered 1 through P, P being an integer greater than 1) in accordance with selection of respective shunt capacitances selectable under control of the controller; and
   for each selected one of multiple operating frequencies (selected operating frequency), the controller is configured to: (1) cause the frequency response of the respective one of the HFHFs (selected HFHF) associated with the selected operating frequency to be tuned to the respective cutoff frequency associated with the selected operating frequency; (2) cause the first SPMT switch circuitry to electrically connect the first single-pole terminal to the respective one of the first multi-throw terminals connected to the selected HFHF; and (3) cause the second SPMT switch circuitry to electrically connect the second single-pole terminal to the respective one of e second multi-throw terminals connected to the selected HFHF; and for each selected operating frequency, the selected HFHF is configured to filter harmonics from the high-power RF input signal to produce a high-power RF output signal.

2. The high-power, frequency-tunable, harmonic filtering system of claim 1, wherein:
the RF input signal is characterized by an average power ($P_{ave}$) of at least 1 Watt and a peak-to-average power ratio (PAPR) in a range of 2 to 10 dB.

3. The high-power, frequency-tunable, harmonic filtering system of claim 1, additionally comprising an antenna connected to the second single-pole terminal, the high-power RF output signal being emitted from the antenna without additional amplification.

4. The high-power, frequency-tunable, harmonic filtering system of claim 1, wherein at least one of the HFHFs is an elliptic filter.

5. The high-power, frequency-tunable, harmonic filtering system of claim 1, wherein the operating frequencies are in a range of 2 to 1000 MHz.

6. The high-power, frequency-tunable, harmonic filtering system of claim 1, wherein N is in a range of 2 through 6.

7. The high-power, frequency-tunable, harmonic filtering system of claim 1, wherein P is 2 or 3.

8. The high-power, frequency-tunable, harmonic filtering system of claim 1, wherein N is 3, P is 3, the RF input signal is characterized by an average power ($P_{ave}$) in a range of 5 to 20 Watt and a peak-to-average power ratio (PAPR) in a range of 2 to 10 dB, and a footprint area of the system is 27 cm² or less.

9. The high-power, frequency-tunable, harmonic filtering system of claim 1, wherein N is 3, P is 3, the RF input signal is characterized by an average power ($P_{ave}$) of 50 Watt or less and a peak-to-average power ratio (PAPR) in a range of 2 to 10 dB, and a footprint area of the system is 50 cm² or less.

10. A method of filtering harmonics for multiple operating frequencies, comprising the steps of:
(A) configuring a plurality of high-power, frequency-tunable harmonic filters (abbreviated HFHF) (numbered 1 through N, N being an integer greater than 1), each one of the multiple operating frequencies being associated with one of the HFHFs, each respective operating frequency being associated with one of multiple cutoff frequencies of the respective HFHF, a frequency response of each of the HFHFs being tunable to multiple cutoff frequencies (numbered 1 through P, P being an integer greater than 1) in accordance with selection of respective shunt capacitances selectable under control of a controller;
(B) tuning the frequency response of a selected one of the HFHFs (selected HFHF) associated with a selected one of the multiple operating frequencies (selected operating frequency) to the respective cutoff frequency associated with the selected operating frequency;
(C) electrically connecting a first single-pole terminal of a first single-pole, multi-throw (SPMT) switch circuitry to a respective one of multiple first multi-throw terminals (numbered 1 through N) of the first SPMT switch circuitry connected to the selected HFHF;
(D) electrically connecting a second single-pole terminal of a second SPMT switch circuitry to a respective one of multiple second multi-throw terminals (numbered 1 through N) of the selected SPMT switch circuitry connected to the selected HFHF;
(E) receiving, by the first single-pole terminal, a high-power radio-frequency (RF) input signal at the selected operating frequency;
(F) filtering, by the selected HFHF, harmonics from the high-power RF input signal to produce a high-power RF output signal; and
(G) transmitting, by the second single-pole terminal, the high-power RF output signal;
wherein each of the HFHFs is interposed between the respective first multi-throw terminal and the respective second multi-throw terminal along a respective RF signal pathway between them.

11. The method of claim 10, wherein:
the first SPMT circuitry additionally comprises first control terminals;
the second SPMT circuitry additionally comprises second control terminals; and
the controller coupled to the first control terminals, the second control terminals, and the HFHFs.

12. The method of claim 10, wherein:
the RF input signal is characterized by an average power ($P_{ave}$) of at least 1 Watt and a peak-to-average power ratio (PAPR) in a range of 2 to 10 dB.

13. The method of claim 10, wherein step (G) additionally comprises: emitting the high-power RF output signal from an antenna connected to the second single-pole terminal without additional amplification.

14. The method of claim 10, wherein at least one of the HFHFs is an elliptic filter.

15. The method of claim 10, wherein the operating frequencies are in a range of 2 to 1000 MHz.

16. The method of claim 10, wherein N is in a range of 2 through 6.

17. The method of claim 10, wherein P is 2 or 3.

* * * * *